(12) United States Patent
Shimizu

(10) Patent No.: US 7,156,943 B2
(45) Date of Patent: Jan. 2, 2007

(54) METHOD AND APPARATUS FOR SEPARATING COMPOSITE

(75) Inventor: Koichi Shimizu, Kyoto (JP)

(73) Assignee: Canon Kabushiki Kaisha, Tokyo (JP)

( * ) Notice: Subject to any disclaimer, the term of this patent is extended or adjusted under 35 U.S.C. 154(b) by 144 days.

(21) Appl. No.: 10/852,138

(22) Filed: May 25, 2004

(65) Prior Publication Data
US 2004/0238663 A1 Dec. 2, 2004

(30) Foreign Application Priority Data
Jun. 2, 2003 (JP) .............................. 2003-156153

(51) Int. Cl.
B26D 1/02 (2006.01)
B32B 37/00 (2006.01)
(52) U.S. Cl. ...................... 156/269; 156/264; 156/251; 156/515; 83/34; 83/613
(58) Field of Classification Search ............... 83/518, 83/613, 34; 156/269, 264, 518, 520, 521, 156/263, 251, 515
See application file for complete search history.

(56) References Cited

U.S. PATENT DOCUMENTS 2,712,169 A * 7/1955 Buttress ...................... 156/347
3,163,569 A * 12/1964 Brundage ..................... 156/108
4,328,067 A * 5/1982 Cesano ........................ 156/511

FOREIGN PATENT DOCUMENTS

JP 8-103910 4/1996
JP 10-335688 12/1998

* cited by examiner

Primary Examiner—Linda Gray
(74) Attorney, Agent, or Firm—Fitzpatrick, Cella, Harper & Scinto

(57) ABSTRACT

A first rigid body has a horizontal surface on which a composite is to be placed and a non-horizontal surface on which the composite is not to be placed, with the horizontal surface and the non-horizontal surface forming a continuous horizontal linear edge. The continuous horizontal linear edge has a first portion, which is an edge of the non-horizontal surface, and a second portion, which is an edge of the horizontal surface, and the composite has a first region provided with a first member and a second region provided without the first member. While the composite is placed so that the first portion corresponds to the first region or the first region and a part of the second region and that the second portion corresponds to the remaining second region, the composite is separated by moving down a second rigid body from above the substrate.

7 Claims, 13 Drawing Sheets

PLAN VIEW

FRONT VIEW

SIDE VIEW

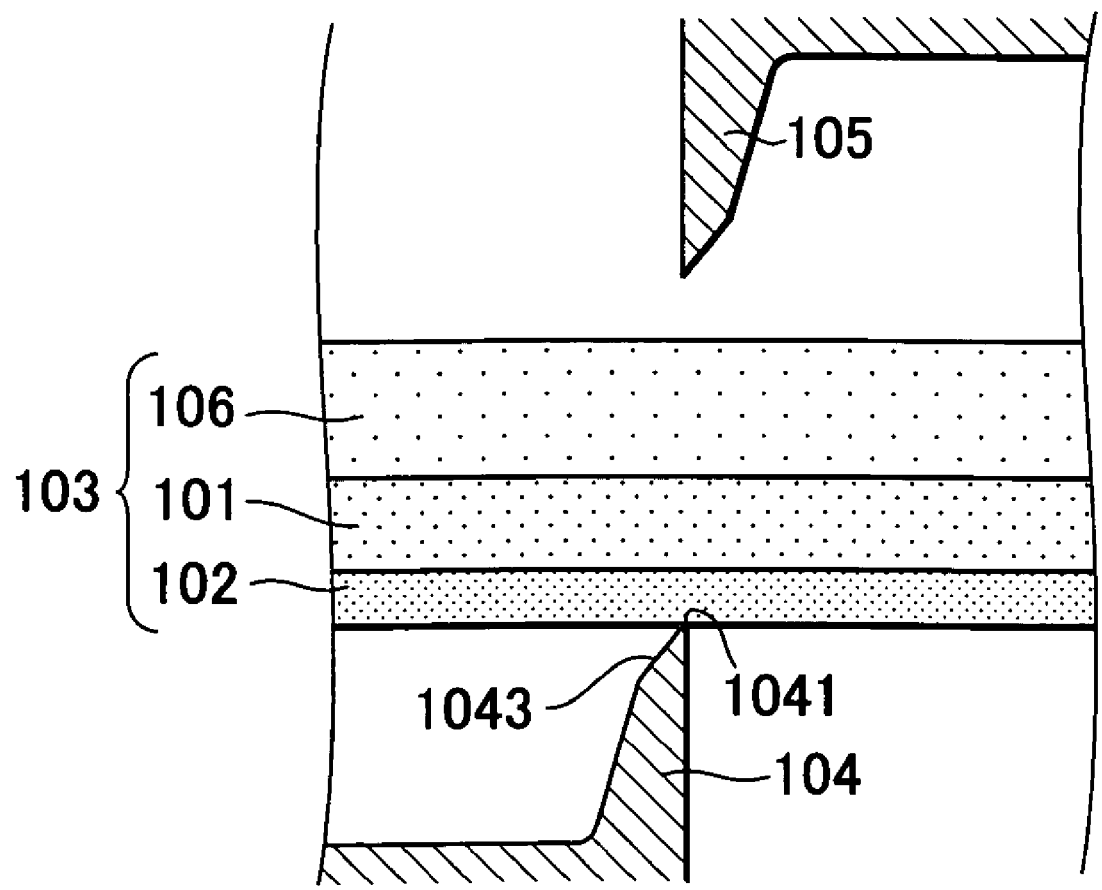

METHOD AND APPARATUS FOR SEPARATING COMPOSITE

BACKGROUND OF THE INVENTION

1. Field of the Invention

The present invention relates to methods for separating a composite composed of at least a substrate and a member fixed thereon by a shearing force applied by a pair of blades.

2. Description of the Related Art

In order to simplify manufacturing processes and to reduce manufacturing costs thereof, in a process for manufacturing products, a method for forming a plurality of products by separating a composite composed of a substrate and various elements provided thereon has been generally carried out.

As methods for separating a composite, various methods such as mechanical shearing, cutting, laser radiation, and water jet, have been well known. Among the various methods mentioned above, mechanical shearing, having a high separation speed and being performed at a low cost, has been widely used.

As a related technique for separating a composite by mechanical shearing, for example, a technique disclosed in Japanese Patent Laid-Open No. 10-335688 may be mentioned. A separation process according to the technique of Japanese Patent Laid-Open No. 10-335688 is shown in FIG. 12 by way of example. Numerals 1 to 4 shown on the left side of FIG. 12 indicate sequential steps of separating a composite 1003. Steps 1 to 4 are shown by cross-sections of the composite 1003 viewed from the front surface (on the left side of FIG. 12) and from the side surface (on the right side of FIG. 12). In the figure, the front surface (on the left side of FIG. 12) is a cross-sectional view of the side surface (on the right side of FIG. 12) taken along the line B–B', and the side surface (on the right side of FIG. 12) is a cross-sectional view of the front surface (on the left side of FIG. 12) taken along the line A–A'.

Step 1 in FIG. 12 shows the state in which a thin semiconductor layer (not shown) is formed on an upper surface of a substrate 1001, a first member 1002 made of a thin metal wire is further fixed onto the upper surface of the substrate 1001 with an insulating material 1006 provided therebetween to form a composite 1003, and in which this composite 1003 is placed on a first rigid body 1004 having a horizontal surface 10042 and a horizontal linear edge 10041, which is an edge thereof.

Furthermore, Steps 2 to 4 in FIG. 12 show the states in which a second rigid body 1005 is moved down from above, and in which the composite 1003 is mechanically separated by a shearing force applied thereto by the first rigid body 1004 and the second rigid body 1005.

A method for placing the composite 1003 on the first rigid body 1004 has not been disclosed in Japanese Patent Laid-Open No. 10-335688; however, a known method as shown in FIG. 8 may be easily employed. Numerals 1 and 2 on the left side of FIG. 8 indicate sequential steps of placing a composite 603 on a horizontal surface 6042 of a first rigid body 604. Steps 1 and 2 are shown by cross-sections of the composite 603 viewed from the front and the side surfaces thereof. In Step 1 shown in FIG. 8, the composite 603 is placed on a stage 612 having a horizontal surface 6121 connected flush with the horizontal surface 6042 so as to be in contact with a pusher 613. Furthermore, in Step 2 shown in FIG. 8, the composite 603 is slid on the horizontal surfaces 6121 and 6042 by the pusher 613, thereby placing the composite 603 on the first rigid body 604. In the method described above, by only controlling the pusher 613, the position at which the composite 603 thus slid is to be stopped can be easily controlled with good reproducibility. Hence, the size of the composite 603 after separation can be controlled with good accuracy, and from this point of view, this technique is superior. In addition, when the apparatus shown in FIG. 8 is manufactured, the number of movable parts is small, and hence this technique is also superior in terms of manufacturing cost.

In addition, as a related technique 2, a technique disclosed in Japanese Patent Laid-Open No. 8-103910 may be mentioned. One example of a separation process according to Japanese Patent Laid-Open No. 8-103910 is shown in FIG. 4. Numerals 1 to 4 shown on the left side of FIG. 4 indicate sequential steps of separating a composite 203. Steps 1 to 4 are shown by cross-sections of the composite 203 viewed from the front surface (on the left side of FIG. 4) and from the side surface (on the right side of FIG. 4). Step 1 in FIG. 4 shows the state in which the composite 203 provided with a printed circuit pattern (not shown), mounted elements (not shown), and the like is placed on a conveyor system composed of a tray 210, cylinders 208, support tables 209, and wheels 207. Next, in Step 2 shown in FIG. 4, the composite 203 is inserted between a first rigid body 204 and a second rigid body 205 by moving the conveyor system. This first rigid body 204 has a horizontal linear edge 2041 at the topmost position. Furthermore, in Step 3 shown in FIG. 4, by moving the cylinders 208 down, the composite 203 is moved down so as to be brought into contact with the horizontal linear edge 2041 of the first rigid body 204. Finally, as shown in Step 4 in FIG. 4, by moving the second rigid body 205 down, a shearing force is applied to the composite 203 by the first and the second rigid bodies 204 and 205, thereby separating the composite 203.

However, the related techniques described above have the following problems.

In the separation method according to Japanese Patent Laid-Open No. 10-335688, as shown in FIG. 6, when a composite has the structure in which a first member 402 is fixed onto a part of a bottom surface 4011 of a substrate 401, that is, when the composite has a first region 40111 provided with the first member 402 thereon and a second region 40112 provided with no first member 402, and when the first region 40111 and the second region 40112 are simultaneously separated, the substrate is liable to be deformed or is liable to be damaged.

FIG. 5 shows a separation process in which a composite 303 having a substrate 301 provided with a first member 302 and a second member 306 on the bottom and the top surfaces, respectively, is fixed by a first rigid body 304 and a second rigid body 305, which are equivalent to those in Japanese Patent Laid-Open No. 10-335688, and subsequently, the substrate 301 and the first member 302 are simultaneously separated. Numerals 1 to 4 on the left side of FIG. 5 indicate individual steps of the separation process described above. Steps 1 to 4 are shown by cross-sections of the composite 303 viewed from the front surface (on the left side of FIG. 5) and from the side surface (on the right side of FIG. 5). In the figure, the front surface (on the left side of FIG. 5) is a cross-sectional view of the side surface (on the right side of FIG. 5) taken along the line B–B', and the side surface (on the right side of FIG. 5) is a cross-sectional view of the front surface (on the left side of FIG. 5) taken along the line A–A'.

Step 1 in FIG. 5 shows the state in which the composite 303 is placed on the first rigid body 304 having a horizontal surface 3042 and a horizontal linear edge 3041 which is an edge thereof. In addition, Steps 2 to 4 show the states in which by moving the second rigid body 305 down, the composite 303 is mechanically separated by a shearing force applied thereto by the first rigid body 304 and the second rigid body 305. As shown in the front view of Step 2, a gap is present between the first rigid body 304 and the substrate 301. In addition, as shown in the side view of Step 2, since the horizontal surface 3042 is present, the first member 302 cannot escape downward. According to the situations described above, as shown in the front view of Step 3 in FIG. 5, deformation of the substrate 301 occurred at a position close to the end portion of the first member 302. When the substrate was not deformed, damage such as cracks occurred in some cases. In addition, even when damage done to the substrate itself was not so serious, thin layers, circuit patterns, elements, and the like formed on the substrate were damaged in some cases, or peeling occurred between the substrate and thin layers, circuit patterns, elements, and the like in some cases.

On the other hand, when the composite as shown in FIG. 6 is separated by the separation method in accordance with Japanese Patent Laid-Open No. 8-103910, unlike the separation method according to Japanese Patent Laid-Open No. 10-335688, the deformation of the substrate or damage done thereto can be suppressed.

FIG. 7 shows a part of the separation process in the case described above. Numerals 1 to 4 shown on the left side of FIG. 7 indicate sequential steps of the separation process. Steps 1 to 4 are shown by cross-sections of a composite 503 viewed from the front surface (on the left side of FIG. 7) and from the side surface (on the right side of FIG. 7). Since a first rigid body 504 of the Japanese Patent Laid-Open No. 8-103910 has a non-horizontal surface having a horizontal linear edge 5041, as shown in the side surface views of Steps 3 and 4 in FIG. 7, the first rigid body 504 can be cut into a first member 502. Hence, the gap between a substrate 501 and the horizontal linear edge 5041 of the first rigid body 504 shown in Step 3 in FIG. 7 disappears in a process from Step 3 to Step 4 without causing any deformation of the substrate 501 or damage done thereto. That is, since the first rigid body 504 does not have a horizontal surface, the deformation of the substrate and the damage done thereto can be suppressed.

However, the separation method according to Japanese Patent Laid-Open No. 8-103910 has a problem in that the simple conveyor system for the composite 603 shown in FIG. 8 cannot be easily used. FIGS. 9 and 10 show sequential conveyor steps when the conveyor system for the composite 603 shown in FIG. 8 is applied to the separation process according to Japanese Patent Laid-Open No. 8-103910. Numerals 1 and 2 on the left side of FIG. 9 and numerals 1 to 3 on the left side of FIG. 10 indicate sequential steps of the conveyor process. The figures are views of composites 703 and 803 when viewed from the side surface. FIG. 9 shows the case in which a horizontal linear edge 7041 of a first rigid body 704 is located at a position higher than that of an upper surface 7121 of a stage 712. Unlike the case shown in FIG. 9, FIG. 10 shows the case in which a horizontal linear edge 8041 of a first rigid body 804 is located at a position lower than that of an upper surface 8121 of a stage 812.

In the case shown in FIG. 9, a substrate 701 of the composite 703 is brought into contact with the first rigid body 704 in a process from Step 1 to Step 2, and the composite 703 then runs onto the first rigid body 704. In this case, the composite 703 is liable to come away from a pusher 713, and as a result, the position at which the composite 703 is to be separated is liable to vary, thereby decreasing the accuracy in size of the composite after separation. In addition, when the substrate 701 is brought into contact with a non-horizontal surface 7043 of the first rigid body 704, deformation of the composite 703 or damage done thereto and/or damage done to the first rigid body 704 may occur with high probability.

In the case shown in FIG. 10, since the composite 803 is pushed by a second rigid body 805 moving down as shown in Step 3, deformation of the composite 803 or damage done thereto may occur at the edge of the stage 812 with high probability. Alternatively, even when the deformation or the damage does not occur, since the composite 803 is pushed down by the second rigid body 805 when it is moved down, the position at which the composite 703 is to be separated is liable to vary, and hence the accuracy in size of the composite after separation is decreased.

In order to prevent the inconveniences shown in FIGS. 9 and 10, it may be considered that the heights of the horizontal linear edges 7041 and 8041 are adjusted to be flush with the upper surfaces 7121 and 8121 of the stages 712 and 812, respectively. However, in practice, in order to prevent the composites 703 and 803 from being brought into contact with the first rigid bodies 704 and 804, respectively, in consideration of the warpage of parts of the composites 703 and 803 protruding from the respective ends of the stages 712 and 812, the horizontal linear edges 7041 and 8041 must be set at positions which are slightly lower than the upper surfaces 7121 and 8121 of the stages 712 and 812, respectively. Hence, as a result, the problem shown in FIG. 10 is liable to occur, and the adjustment of the positions described above has been difficult. In addition, since the warpage of the composites 703 and 803 varies from composite to composite, even when the adjustment is performed once, when another composite 703 or 803 is provided, the problem shown in FIG. 9 may arise in some cases, and as a result, a problem in that the yield is liable to be decrease cannot be solved.

According to the technique disclosed in Japanese Patent Laid-Open No. 8-103910, since the first rigid body 204 does not have a horizontal surface, a very complicated conveyor method as described below must be performed. That is, as shown in FIG. 4, after being placed on the conveyor system composed of the tray 210, the cylinders 208, the support tables 209, and the wheels 207, the composite 203 in this state is moved to a position between the first rigid body 204 and the second rigid body 205 by moving the conveyor system, and the cylinders 208 are then moved down so that the composite 203 is brought into contact with the horizontal linear edge 2041 of the first rigid body 204. As a result, the position at which the composite 203 is to be separated is liable to vary, and the accuracy in size of the composite after separation is disadvantageously degraded. In addition, in order to realize the complicated conveyor method as described above, the number of components is increased, and as a result, a problem in that cost reduction cannot be easily achieved still remains.

SUMMARY OF THE INVENTION

As described above, the present invention was made to solve the problems of the techniques disclosed, for example, in Japanese Patent Laid-Open Nos. 10-335688 and 8-103910, and an object of the present invention is to provided a method for separating a composite, which can achieve superior accuracy and higher yield on the whole and can be performed at lower cost. In addition, another object of the present invention is to provide a separation apparatus which can perform the separation method described above.

More particularly, the present invention provides a separation method in which a composite 403 composed of the substrate 401 and the first member 402 fixed onto a part of the bottom surface 4011 thereof as shown in FIG. 6, that is, the composite 403 having the first region 40111 provided with the first member 402 and the second region 401112 provided with no first member 402, is moved to a position between a first rigid body 404 and a second rigid body 405 and is then sheared by the first and the second rigid bodes 404 and 405, thereby simultaneously separating the first region 40111 and the second region 40112 without causing any deformation of the substrate 401 and any damage done thereto. In addition, the separation method of the present invention can easily move the composite 403 onto the first rigid body with superior accuracy and high yield.

To achieve the objects described above, in accordance with one aspect of the present invention, there is provided a method for separating a composite having at least a substrate and a first member fixed onto a part of the bottom surface of the substrate using a first rigid body and a second body, the first rigid body having a horizontal surface on which the composite is to be placed and a non-horizontal surface on which the composite is not to be placed, the horizontal surface and the non-horizontal surface forming a continuous horizontal linear edge, the horizontal linear edge having a first portion which is an edge of the non-horizontal surface and a second portion which is an edge of the horizontal surface.

The method described above comprises the steps of: applying a shearing force with the first rigid body and the second rigid body to a first region of the substrate which is a region provided with the first member and a second region which is a region of the substrate provided without the first member: and in applying the shearing force, moving the second rigid body down from above a top surface of the substrate while the composite is placed so that the first portion corresponds to the first region or the first region and a first part of the second region and that the second portion corresponds to a remaining part of the second region.

In addition, the separation method of the present invention described above may further comprise the step of providing the first rigid body with a convex cross-sectional shape when taken along a virtual vertical face perpendicularly intersecting the first portion of the horizontal linear edge, the convex shape having an apex at a position at which the horizontal linear edge and the virtual vertical face intersect each other, with a height of the convex shape in the vertical direction being larger than a height of the first member in the vertical direction.

The separation method of the present invention described above may further comprise the step of providing the first rigid body with a convex cross-sectional shape when taken along a virtual vertical face perpendicularly intersecting the first portion of the horizontal linear edge, the convex shape having an apex at a position at which the horizontal linear edge and the virtual vertical face intersect each other, with an apex angle of the convex shape being in the range of from 30 to 70°.

In addition, the separation method of the present invention described above may further comprise the step of pushing an end surface of the substrate to slide the composite on the horizontal surface so that the first portion corresponds to the first region or the first region and the first part of the second region and that the second portion corresponds to the remaining part of the second region.

In addition, the separation method of the present invention described above may further comprise the step of, after the above pushing step, moving a holding member down from above to fix the composite between the holding member and the horizontal surface of the first rigid body.

The separation method of the present invention described above may further comprise the step of providing the first rigid body with a first component having the non-horizontal surface and a second component having the horizontal surface, the first component and the second component being integrally assembled.

In addition, in accordance with another aspect of the present invention, there is provided a separation apparatus for separating a composite having at least a substrate and a first member fixed onto a part of the bottom surface of the substrate. The separation apparatus comprises: a first rigid body and a second rigid body, in which the first rigid body has a horizontal surface on which the composite is to be placed and a non-horizontal surface on which the composite is not to be placed, the horizontal surface and the non-horizontal surface form a continuous horizontal linear edge, and the horizontal linear edge has a first portion which is an edge of the non-horizontal surface and a second portion which is an edge of the horizontal surface. In the separation apparatus described above, the second rigid body is moved down from above a top surface of the substrate while the composite is placed so that first portion corresponds to a first region of the composite, which is a region provided with the first member, or to the first region and a first part of a second region of the composite, which is a region provided without the first member, and that the second portion corresponds to a remaining part of the second region.

Further objects, features and advantages of the present invention will become apparent from the following description of the preferred embodiments with reference to the attached drawings.

BRIEF DESCRIPTION OF THE DRAWINGS

FIG. 13 is a view showing a separation apparatus used in comparative example 2.

DESCRIPTION OF THE PREFERRED EMBODIMENTS

Hereinafter, the embodiments of the present invention will be described.

Figure 6:
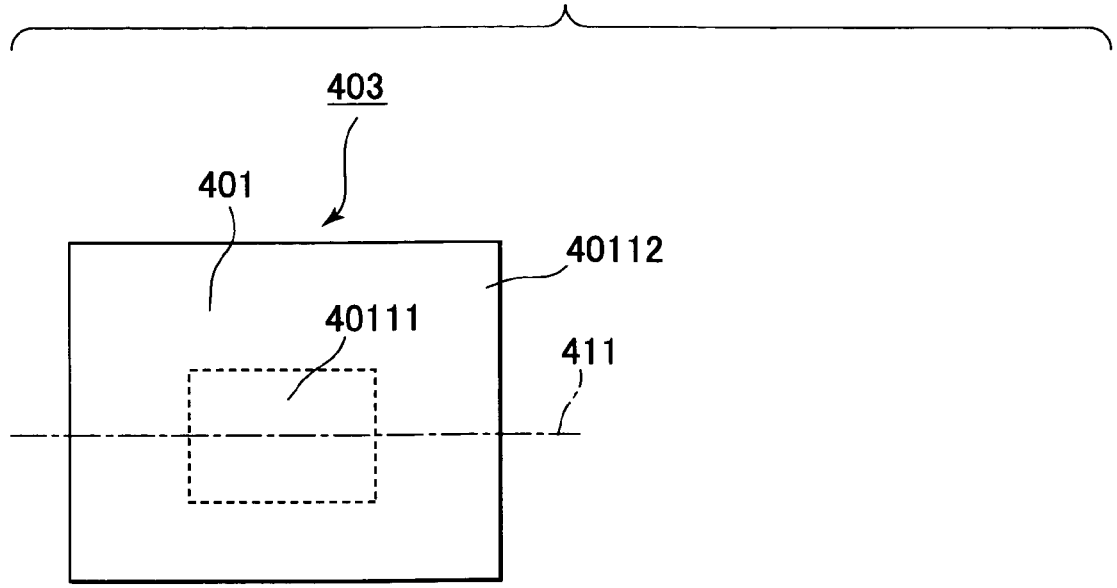
FIG. 6 is a view showing an example of a composite to be separated according to the present invention.
Figure 6:
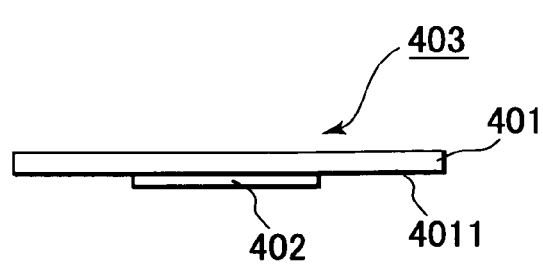
Figure 6:
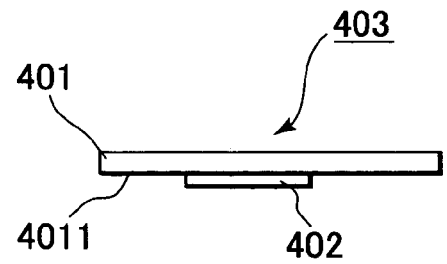
Figure 7:
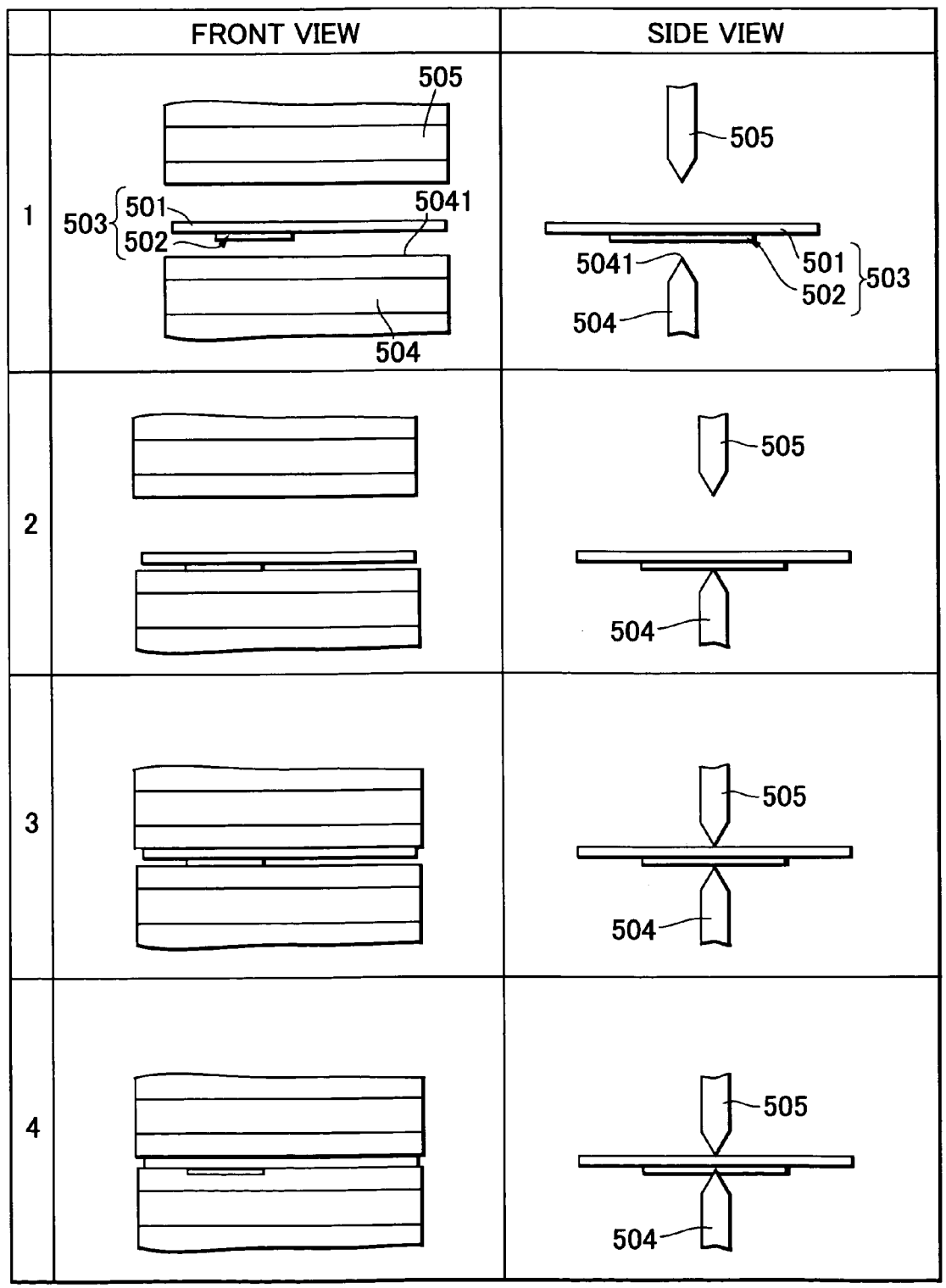
FIG. 7 is a view showing a process for separating a composite, according to a separation method disclosed in Japanese Patent Laid-Open No. 8-103910.
Figure 8:
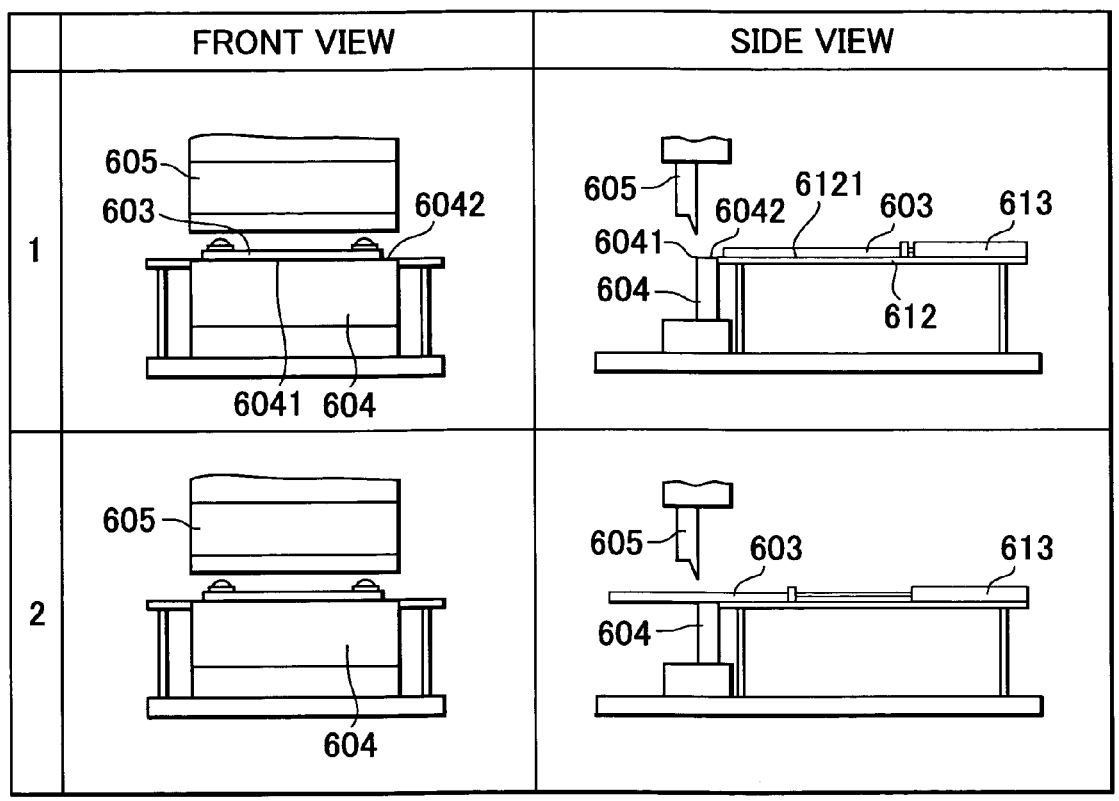
FIG. 8 is a view for illustrating a process for placing a composite on a horizontal surface of a first rigid body.
Figure 9:
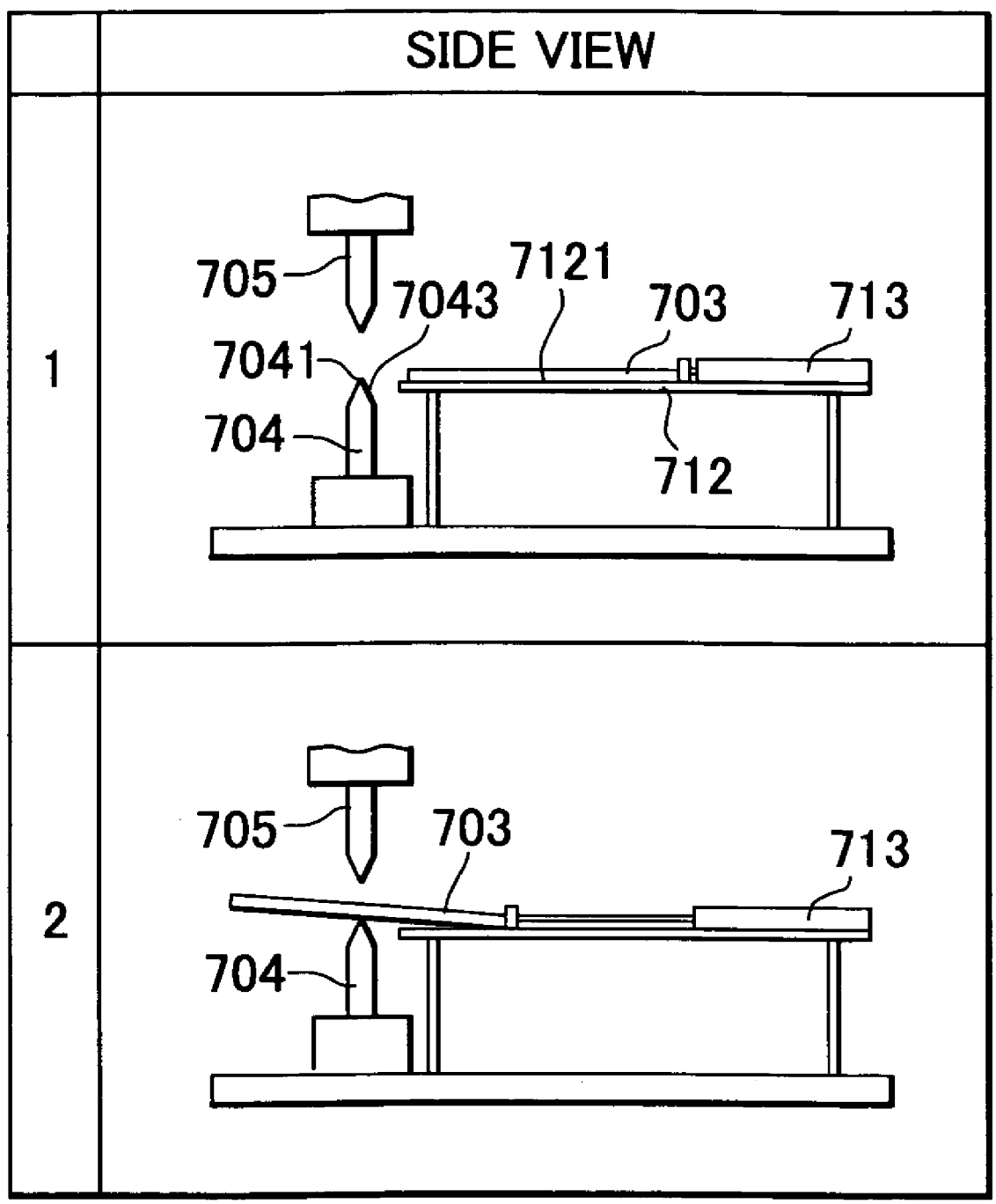
FIG. 9 is a view for illustrating a problem that is to be solved by the present invention.
Figure 10:
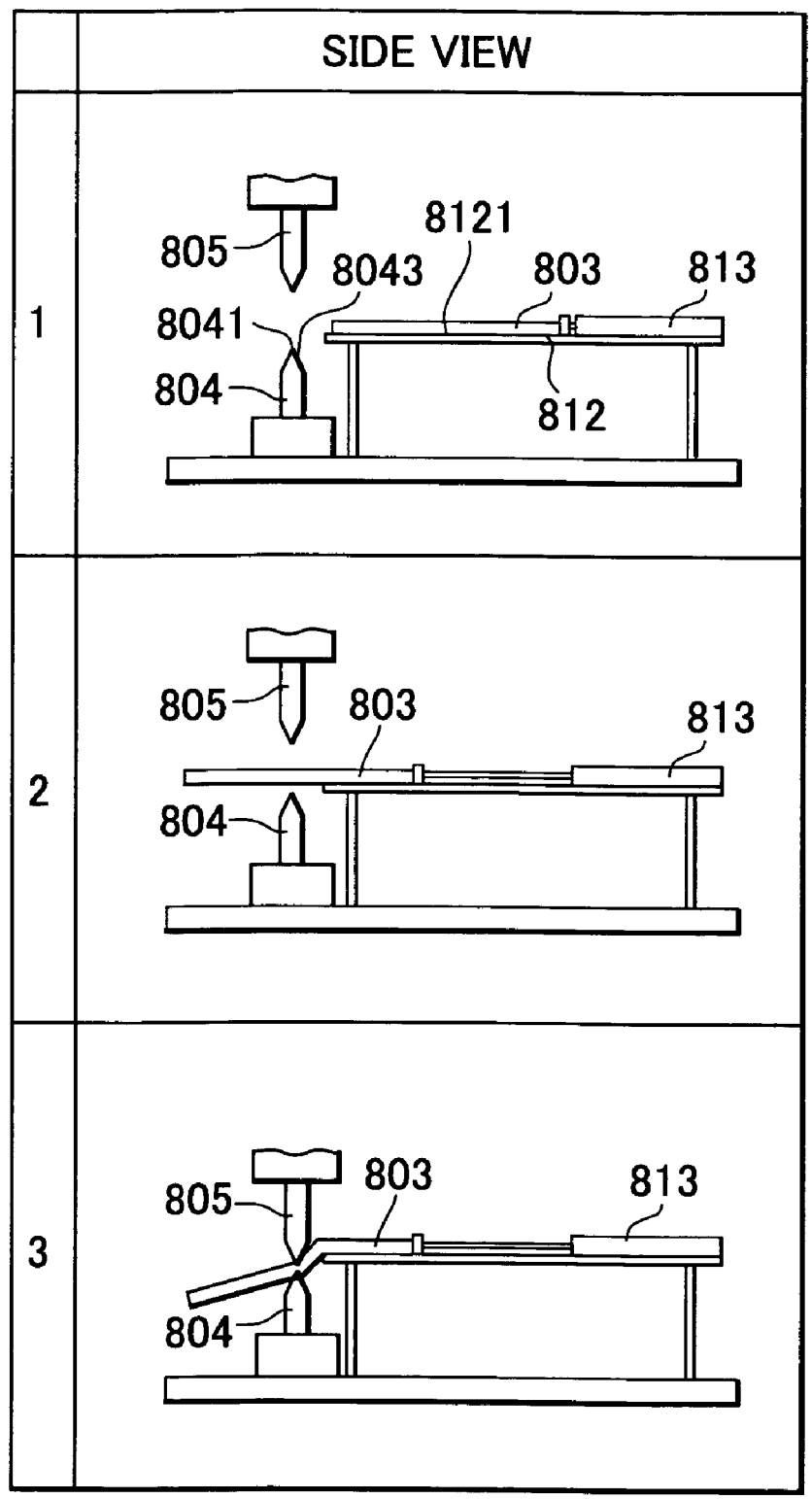
FIG. 10 is a view for illustrating a problem that is to be solved by the present invention.

The present invention relates to a method for separating a composite composed of a substrate and a first member. FIG. 6 shows one example of a composite according to the present invention, and with reference to FIG. 6, the composite according to the present invention will be described. However, the composite of the present invention is not limited to the structure shown in FIG. 6.

The composite of the present invention is composed of at least the substrate 401 and the first member 402 fixed onto a part of the bottom surface 4011 of the substrate 401. The substrate 401 has a plate-shaped structure and functions of maintaining and protecting shapes, locations, functions, and the like of components, thin films, and the like formed on the surface of the substrate 401. A material for the substrate 401 is not particularly limited as long as it can be processed by mechanical shearing, and in general, a substrate made of a metal, a resin, or a ceramic has been used.

The bottom surface 4011 of the substrate 401 is one of the major surfaces thereof, and when the composite 403 is held horizontally for separation thereof, the bottom surface 4011 is located at a level below the other major surface. Any one of the two major surfaces of the substrate 401 may be used as the bottom surface 4011.

The first member 402 is not particularly limited and is generally an electronic element, a circuit pattern, an electrode, or the like, and as a material for the first member 402, for example, a resin, a metal, or a ceramic may be mentioned. A method for fixing the first member 402 to the bottom surface 4011 of the substrate 401 is not particularly limited. In general, adhesion with a resin, welding, or a method using a magnetic force, an electrostatic force, or a friction force may be used. An adhesion position between the first member 402 and the substrate 401 may be parts of the individual surfaces facing each other or the entire surfaces thereof. In addition, a member other than the first member 402 may be fixed onto the substrate 401. The substrate 401 has the first region 40111 provided with the first member 402 and the second region 40112 provided with no first member 402.

The present invention provides a method for simultaneously separating the first region 40111 and the second region 40112 of the composite, which is described with reference to FIG. 6 by way of example, along a separation line 411 shown in the figure.

Figure 11:
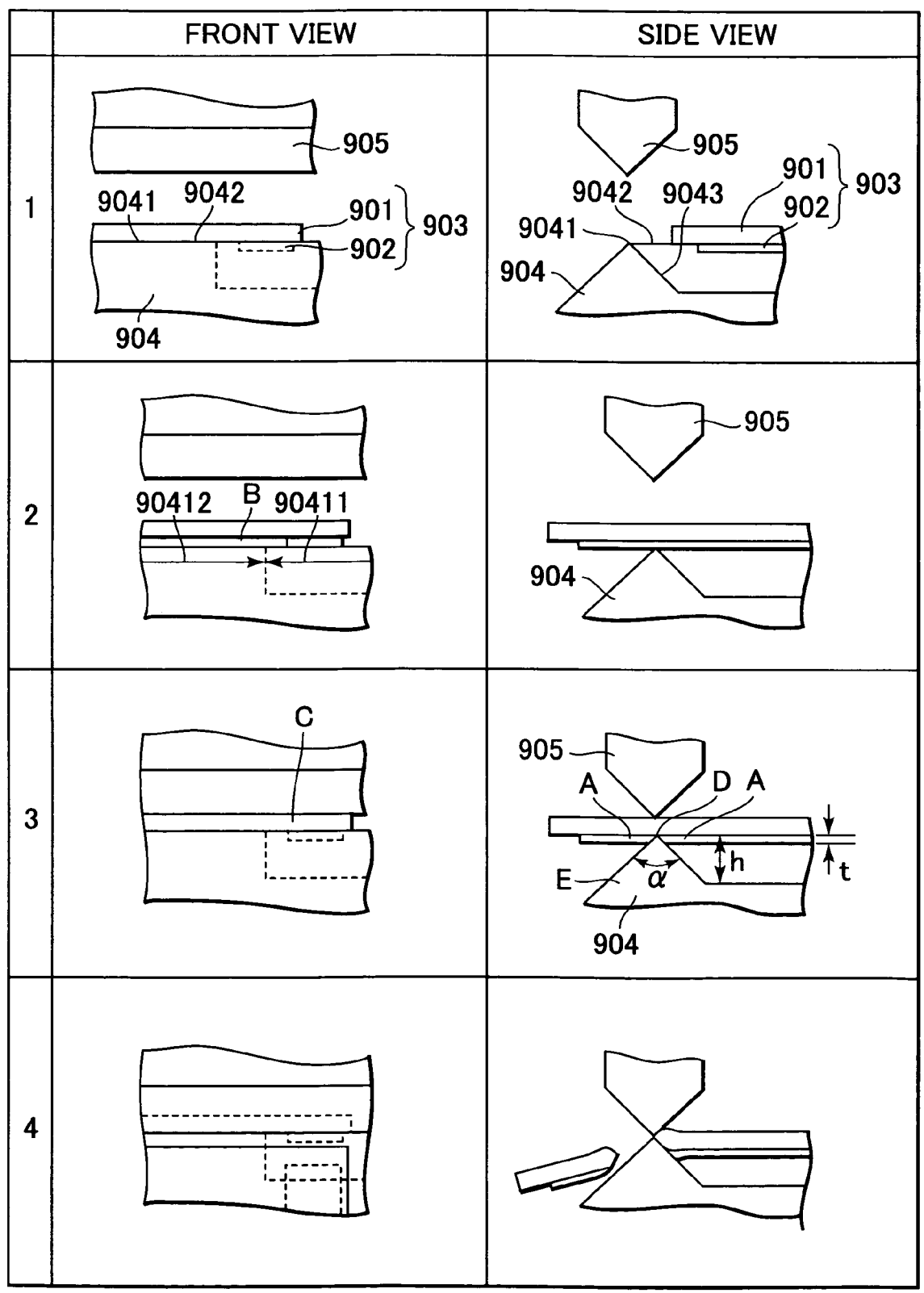
FIG. 11 is a view showing a process for separating a composite of an embodiment according to the present invention.
Figure 12:
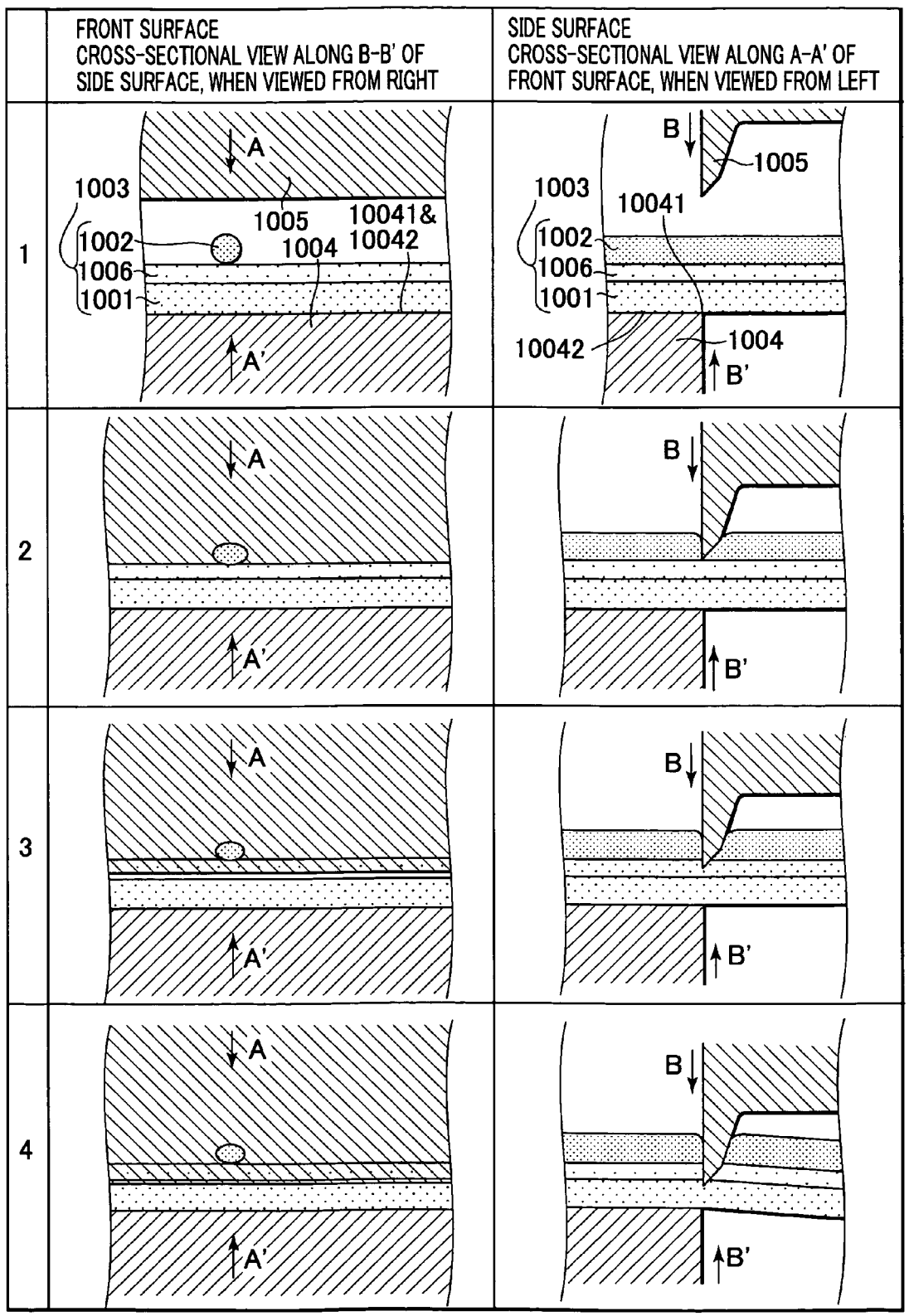
FIG. 12 is a view showing a process for separating a composite, according to a separation method disclosed in Japanese Patent Laid-Open No. 10-335688.

In FIG. 11, an example of a separation method of the present invention is shown. FIG. 11 shows an example for illustrating an embodiment of the present invention and is not intended to limit the present invention. FIG. 11 shows a process for separating a composite 903 which is similar to the composite 403 shown in FIG. 6. Numerals 1 to 4 on the left side of FIG. 11 indicate sequential steps of the process mentioned above. Steps 1 to 4 are shown by cross-sections viewed from the front surface of the composite 903 (on the left side of FIG. 11) and from the side surface thereof (on the right side of FIG. 11).

The composite 903 is separated by a first rigid body 904 and a second rigid body 905. The rigid body is a body having a very small elastic deformation. In more particular, any rigid body may be used when the elastic deformation thereof caused by application of a force, which may cause plastic deformation of the composite 903, is extremely small as compared to the thickness thereof. In general, a quenched metal, such as super steel or powdered high speed steel, and a hard ceramic may be used.

The first rigid body 904 comprises a horizontal linear edge 9041. The edge mentioned above is formed of an edge of a horizontal surface 9042, which is formed on the upper surface of the first rigid body 904, and an edge of a non-horizontal surface 9043 and is a line of intersection formed among the side surface of the first rigid body 904, the horizontal surface 9042, and the non-horizontal surface 9043. The horizontal linear edge 9041 is the line of intersection described above and is horizontal and linear. In this case, when the slope formed by the difference in height of the two ends of the horizontal linear edge 9041 is sufficiently small as compared to the thickness of the composite 903, the slope described above can be regarded as horizontal.

The first rigid body 904 of the present invention further comprises the horizontal surface 9042. This horizontal surface is a shape of the surface of the first rigid body 904 and indicates a horizontal flat surface, the shape being regarded as a smooth and flat surface when the irregularities thereof, which are sufficiently small as compared to the thickness of the composite 903, are ignored. In this case, when the slope made by the difference in height of the two ends of the horizontal surface 9042 is sufficiently small as compared to the thickness of the composite 903, the slope described above can be regarded as horizontal.

From Step 1 to Step 2 shown in FIG. 11, the composite 903 is slid on the horizontal surface 9042 and is placed so that a first portion 90411 of the horizontal linear edge 9041, which is an edge of the non-horizontal surface 9043, corresponds to the first region and a part of the second region of the composite 903, and that a second portion 90412 of the horizontal linear edge 9041, which is an edge of the horizontal surface 9042, corresponds to the remaining second region. The sliding in this embodiment is to smoothly move the composite 903 on the horizontal surface 9042 by sliding. In this step, since the second portion 90412 of the horizontal linear edge 9041, which is the edge of the horizontal surface 9042, is present, when being only slid on the horizontal surface 9042, the composite 903 is led onto the horizontal linear edge 9041. Hence, without bringing the substrate 901 into contact with the non-horizontal surface 9043 of the first rigid body 904, the state of the composite 903 can be easily formed in which the first portion 90411 of the horizontal linear edge 9041, which is the edge of the non-horizontal surface 9043, and the second portion 90412 of the horizontal linear edge 9041, which is the edge of the horizontal surface 9042, correspond to the first region and a part of the second region of the composite 903 and to the remaining second region, respectively. As a result, first, deformation and damage can be prevented which are caused by the collision of the first rigid body 904 with the non-horizontal surface 9043. Second, when the composite 903 is sandwiched between the second rigid body 905 and the first rigid body 904 on the surface thereof, the positional accuracy of the composite 903 on the first rigid body 904 is improved, and as a result, the accuracy in size of the composite 903 after separation can be improved. Third, since the composite 903 may only be slid on the first rigid body 904, a complicated conveyor system for the composite 903 is not required, and hence cost reduction can be easily achieved.

The length of the first portion 90411 of the horizontal linear edge 9041, which is the edge of the non-horizontal surface 9043, is preferably slightly larger than the width of the first member 902. The reasons for this are that when the length of the first portion 90411 is smaller than the width of the first member 902, as is the method disclosed in Japanese Patent Laid-Open No. 10-335688, the substrate 901 is deformed at the end portion of the first member 902, and that when the length of the first portion 90411 is equal to the width of the first member 902, the placement of the composite 903 on the first rigid body 904 must be accurately performed.

In Step 2 and Step 3 shown in FIG. 11, the second rigid body 905 is moved down from above the composite 903. In this step, since the horizontal linear edge 9041 corresponding to the first region of the composite 903 provided with the first member 902 is the edge of the non-horizontal surface, the first rigid body 904 is cut into the first member 902 as shown in the side view of Step 3 in FIG. 11, and an effect of removing an unnecessary part A downward along the non-horizontal surface 9043 is obtained. Due to the effect described above, for a period of time until a gap portion B between the substrate 901 and the first rigid body 904 shown in the front view of Step 2 disappears in Step 3, a stress can be reduced that is concentrated on a portion C of the substrate 901 since the substrate 901 is only supported by the first member 902, and as a result, the deformation of the substrate 901 or damage done thereto at the portion C can be prevented.

The non-horizontal surface of this embodiment is a shape of the surface of the first rigid body 904, is a surface to be judged as a smooth surface when small irregularities thereof as compared to the thickness of the composite 903 are ignored, and is a surface to be judged to be non-horizontal. The slope of the non-horizontal surface 9043 may be good enough when being apparently discriminated from the range in which the horizontal surface 9042 is judged to be horizontal.

In Step 3 and Step 4 shown in FIG. 11, a shearing force is sufficiently applied to the substrate 901, thereby completing the separation of the composite 903.

In a cross-sectional shape (side view of FIG. 11) of the first rigid body 904 taken along a virtual vertical face perpendicularly intersecting the first portion 90411 of the horizontal linear edge 9041, the height (h shown in Step 3 in FIG. 11) in the vertical direction of a convex shape (E shown in Step 3 in FIG. 11) having an apex formed at the intersection (D shown in Step 3 in FIG. 11) between the horizontal linear edge 9041 and the virtual vertical face is preferably larger than the height (t shown in Step 3 in FIG. 11) of the first member 902 in the vertical direction. In this embodiment, the height of the convex shape is the difference in height in the vertical direction between the intersection D described above and a point on one line of the two lines of intersection, which are formed between the virtual vertical face and the non-horizontal linear edge 9041 and which start from the intersection D formed between the virtual vertical face and the horizontal linear edge 9041, said one line forming a horizontal line, that is, a line having a slope of zero, faster than the other line. Since the height of the convex shape is larger than the height of the first member 902 in the vertical direction, the first rigid body 904 is cut into the first member 902 as shown in the side view of Step 3 in FIG. 11, and a sufficient effect of removing the unnecessary part A of the first member 902 downward along the non-horizontal surface 9043 can be obtained. Accordingly, due to the effect described above, for a period of time until the gap B between the substrate 901 and the first rigid body 904 shown in the front view of Step 2 disappears in Step 3, a stress can be reduced that is concentrated on the portion C of the substrate 901 since the substrate 901 is only supported by the first member 902, and as a result, the deformation of the substrate 901 or damage done thereto at the portion C can be more effectively prevented.

In addition, in the cross-sectional shape (side view of FIG. 11) of the first rigid body 904 taken along a virtual vertical face perpendicularly interesting the first portion 90411 of the horizontal linear edge 9041, the apex angle ($\alpha$ shown in Step 3 in FIG. 11) of the convex shape (E shown in Step 3 in FIG. 11) having an apex formed at the intersection (D shown in Step 3 in FIG. 11) between the horizontal linear edge 9041 and the virtual vertical face is preferably in the range of from 30 to 70°. In this embodiment, the apex angle $\alpha$ is an angle formed by two tangential lines of the two lines of intersection at the intersection D described above, the two lines of intersection being formed between the virtual vertical face and the non-horizontal linear edge 9041. When this apex angle is 30° or more, the effect of increasing strength of the horizontal linear edge 9041 can be significantly enhanced. When the apex angle is less than 30°, the first portion 90411 of the horizontal linear edge 9041 is chipped in a step of separating the composite 903, and the substrate 901 is deformed or damaged at a position at which the horizontal linear edge 9041 is chipped. Accordingly, the effect of suppressing the deformation and damage of the substrate 901 is decreased. In addition, since the apex angle is 70° or less, the effect of suppressing the deformation and damage of the substrate 901 can be significantly enhanced. The reason for this is that since the apex angle is 70° or less, the first portion 90411 of the horizontal linear edge 9041 can easily cut into the first member 902.

From Step 1 to Step 2 shown in FIG. 11, as a method for sliding the substrate 901 on the horizontal surface 9042, a method for pushing an end surface (not shown) of the substrate 901 is preferable. The reason for this is that the method described above is simple and easy as compared to a method for pulling another end surface of the substrate 901 or a method for absorbing a surface thereof.

In Step 2 shown in FIG. 11, after the state in which the composite 903 is placed on the first rigid body 904 is obtained, it is preferable that a holding member (not shown) be moved down from above the composite 903, and that the composite 903 be sandwiched between the horizontal surface 9042 of the first rigid body 904 and the holding member (not shown) for fixing the composite 903 on the first rigid body 904. Accordingly, the effect of preventing the substrate 901 from being deformed and damaged in the vicinity (C portion in FIG. 11) of the end of the first member 902 can be further enhanced. The reason for this is that since the composite 903 is fixed onto the first rigid body 904 with the holding member (not shown), the first portion 90411 of the horizontal linear edge 9041 can more effectively cut into the first member 902.

In addition, it is preferable that the first rigid body 904 be integrally formed of a first component having the non-horizontal surface 9043 and a second component having the horizontal surface 9042. By the structure described above, when the first portion 90411 of the horizontal linear edge 9041 is chipped, the first component can only be replaced. Accordingly, the convex shape E can be selected so as to have an apex angle which is more fragile but can easily suppresses the deformation of the substrate 901 at the C portion in Step 3 shown in FIG. 11.

EXAMPLES

The method for separating a composite, according to the present invention, will be described in detail with reference to examples; however, the present invention is not limited to the examples described below.

Example 1

Figure 1:
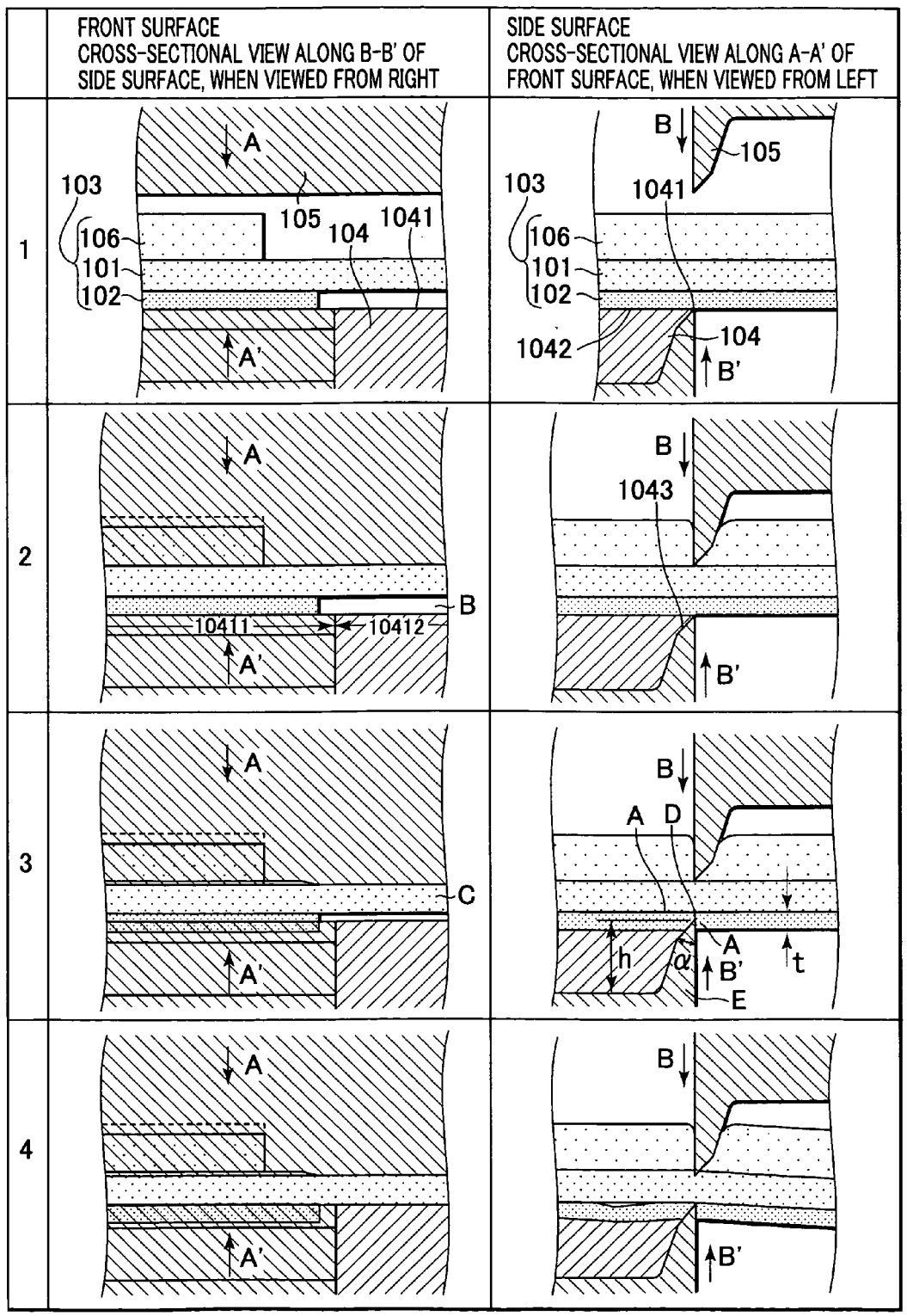
FIG. 1 is a view showing a process for separating a composite of an example according to the present invention.

FIG. 1 shows a method for separating a composite, according to this example. FIG. 1 shows a process for simultaneously separating a composite 103 with a first rigid body 104 and a second rigid body 105. Numerals 1 to 4 on the left side of FIG. 1 indicate steps of the process mentioned above. Steps 1 to 4 are shown by cross-sections of the composite 103 viewed from the front surface (on the left side of FIG. 1) and from the side surface (on the right side of FIG. 1). In the figure, the front view is a cross-section taken along B–B' of the side surface (on the right side of FIG. 1), and the side view is a cross-sectional view taken along A–A' of the front surface (on the left side of FIG. 1).

Figure 2:
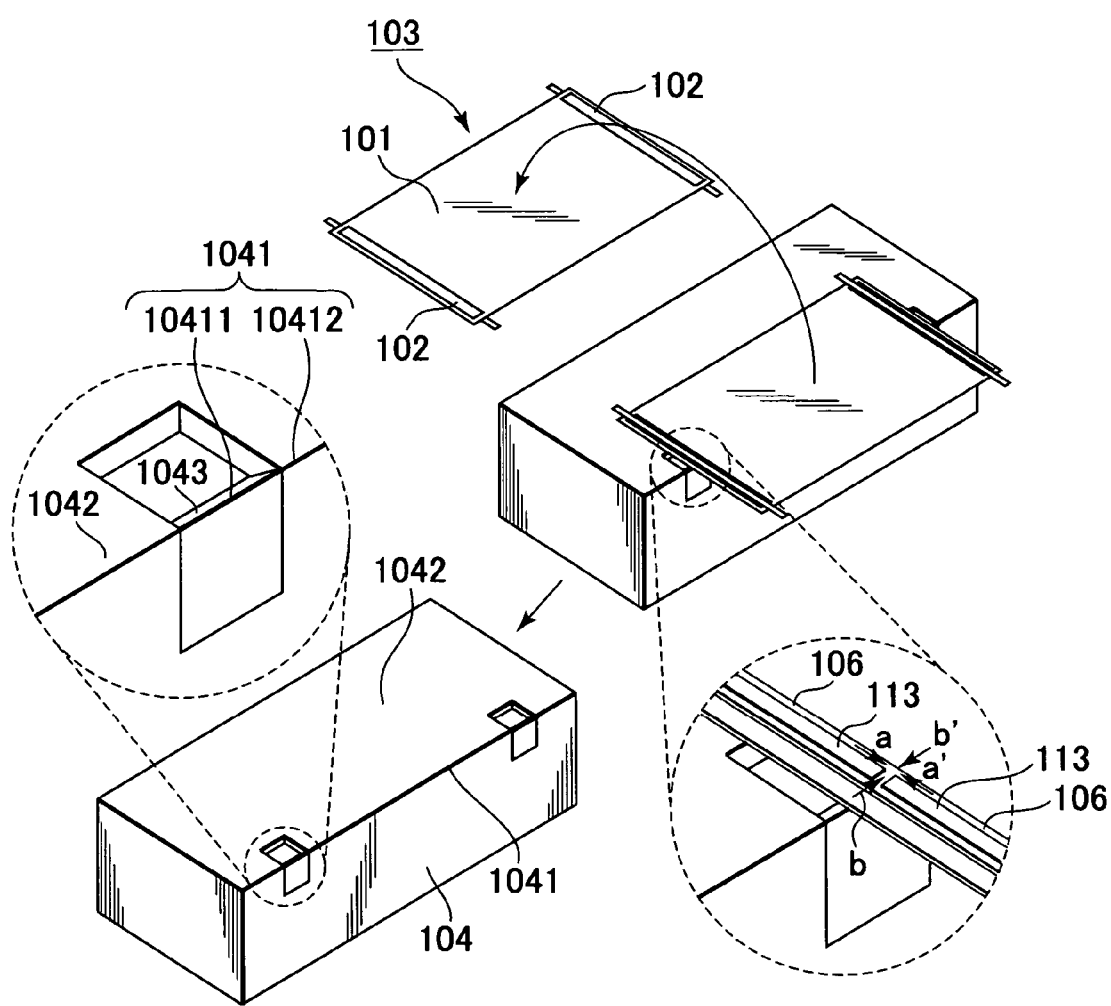
FIG. 2 is a view for illustrating a first rigid body and a composite, which are used in an example according to the present invention.

In addition, FIG. 2 shows the composite 103 of this example placed on the first rigid body 104 (Step 1 shown in FIG. 1), the composite 103 placed upside down, and the first rigid body 104 itself. The side view of Step 1 in FIG. 1 is an enlarged view of a cross-section taken along the line a–a' in FIG. 2. In addition, the front view of Step 1 in FIG. 1 is an enlarged view of a cross-section taken along the line b–b' in FIG. 2. However, in FIG. 2, the second rigid body 105 is not shown in the figure.

First, the composite 103 of this example was formed in accordance with the following process. The composite 103 of this example was a photovoltaic element. The composite 103 comprised a conductive substrate 101 and a first member 102.

First, a conductive mother substrate 101 was formed. A stainless steel substrate (SUS 430BA), 150 m long, 150 μm thick, and 36 cm wide, coiled in the form of a roll was moved through a roll-to-roll type cleaning machine, so that the surface of the stainless steel substrate was washed. As a washing method, a method was employed in which ultrasonic washing was sufficiently performed with acetone and isopropyl alcohol, followed by hot-air drying in a dryer maintained at 110° C. Next, by using a roll-to-roll type sputtering apparatus similar to the case described above, a Ag light reflective layer 0.45 μm thick was formed as a rear reflective layer on the stainless steel substrate at a substrate temperature of 350° C., and a ZnO transparent conductive layer 2.0 μm thick was then formed on the rear reflective layer at a substrate temperature of 350° C., thereby forming a conductive base member. The ZnO layer is used as a diffusion prevention layer.

Next, a photovoltaic layer (not shown) was formed on the mother substrate 101. By moving the above roll through a known roll-to-roll type CVD apparatus, the photovoltaic layer was formed. An n-type layer (25 nm thick) of a-Si by a RFPCVD method, an i-type layer (80 nm) of a-SiGe by an MWPCVD method, a p-type layer (5 nm thick) of μc-Si by a RFPCVD method (the above three layers form a bottom layer), an n-type layer (10 nm thick) of a-Si by a RFPCVD method, an i-type layer (75 nm) of a-SiGe by an MWPCVD method, a p-type layer (5 nm thick) of μc-Si by a RFPCVD method (the above three layers form a middle layer), an n-type layer (10 nm thick) of a-Si by a RFPCVD method, an i-type layer (85 nm) of a-Si by an RFPCVD method, and a p-type layer (4 nm thick) of μc-Si by a RFPCVD method (the above three layers form a top layer) were formed in that order. As a result, an a-Si/a-SiGe/a-SiGe type photovoltaic layer was formed.

In addition, on this photovoltaic layer, an ITO layer 70 nm thick was formed by a sputtering method.

The germanium compositions of the i-type layers were 0.60 in the bottom layer and 0.50 in the middle layer. In addition, the bandgaps of the i-type layers were 1.35 eV, 1.40 eV, and 1.75 eV in the bottom layer, the middle layer, and the top layer, respectively.

Next, a mother laminate formed of the mother substrate 101 in the form of a roll having a width of 36 cm, the photovoltaic layer, and the ITO layer was cut into laminates having a size of 24 cm by 36 cm using a mold pressing machine. Approximately 2,000 laminates each made of the substrate 101 and the photovoltaic layer (not shown) were obtained. Furthermore, parts of the ITO layer were removed at end portions thereof and along the center line of the laminate in the direction perpendicular to the side having a length of 24 cm, the parts of the ITO layer thus removed having a width of 1 mm. The removal was performed by a known etching method in which current was allowed to flow between the laminate and an electrode facing thereto in a sulfuric acid solution.

Next, the first members 102 made of copper 100 μm thick, 7 mm wide, and 24 cm long were fixed onto the bottom surface of the substrate 101 by laser welding along the two sides having a length of 24 cm of the four sides of the laminate. The welding was discretely performed at a plurality of locations. In addition, double-sided tape 106 having a width of 7 mm and a length of 24 cm was adhered onto the ITO layers. The tape had a five-layered structure (not shown) of a silicon adhesive (50 μm), a PET base (75 μm), a silicone adhesive (50 μm), a polyimide base (25 μm), and a silicon adhesive (50 μm). Furthermore, 42 collector wires (not shown) having a length of 36 cm were adhered onto the ITO layer along the side having a length of 36 cm of the laminate at the regular intervals of 5.6 mm. The wires were each adhered onto the double-sided tapes 106 provided at the two sides of the laminate for temporary fixing. In this step, an appropriate tension was applied to each wire to prevent it from being loosened.

This collector wire was a wire collecting current from the transparent electrode (ITO layer). The structure of the wire was formed of a soft oxygen free copper wire 100 μm in diameter having a silver clad coating 2 μm thick and a conductive resin coating layer 25 μm thick provided thereon. The conductive resin coating layer had a two-layered structure made of an interior layer 5 μm thick and an exterior layer 20 μm thick. By using a paint shaker, the interior resin was formed by mixing and dispersing, on a part by weight basis, 33 parts of carbon black; 6.4 parts of a butyral resin; 4.2 parts of an aromatic hydrocarbon resin such as a phenol resin or a cresol resin; 18 parts of a diol isocyanate as a curing agent; 18 parts of xylene, 12 parts of diethylene glycol monomethyl ether, and 3.6 parts of cyclohexane as a solvent; and 0.7 parts of γ-mercaptopropyl trimethoxysilane as a coupling agent. When being passed through a treatment bath lined with felt, copper core wires covered with silver clad coating was coated with the interior resin, and after an unnecessary conductive resin was removed, the interior resin was fully cured in a dryer. The thickness of the interior conductive resin layer was 5 μm. The exterior resin was also obtained on the core wire having the interior layer by a process performed in a treatment bath as is the case of the interior resin. The exterior conductive resin was formed by mixing and dispersing using a paint shaker, on a part by weight basis, 35 parts of carbon black; 41 parts of a urethane resin; 14 parts of a phenoxy resin; 6 parts of hydrogenated diphenylmethane diisocyanate used as a curing agent; 4 parts of an aromatic solvent used as a solvent; and 0.7 parts of γ-mercaptopropyl trimethoxysilane as a coupling agent. After the coating, an unnecessary resin was removed using a die, the resin was semi-cured in a dryer, and the wire thus formed was then coiled around a bobbin. In this step, by adjusting the feed speed of the wire and the diameter of the die, the thickness of the exterior conductive resin layer was set to 20 μm.

Next, silver-plated hard copper foils 113 having a thickness of 100 μm, a length of 13 cm, and a width of 5.5 mm were adhered onto each of the double-sided tape 106 described above. By the foils described above, the collector wires were sandwiched between the two-sided tape 106 and the copper foils 113, and hence the temporary fixing of the wires was further enhanced. However, a gap 1 mm long was provided between the copper foils 113 so that the center line of the laminate perpendicular to the side 24 cm long was not covered with the copper foil 113. An enlarged view of this part is shown in the circle in FIG. 2.

The entire composite thus formed was placed in a vacuum laminator and was then heated to 210° C. for 45 seconds. This vacuum laminator is an apparatus in which a sample placed on a metal substrate incorporating a heater is covered with a resin sheet, and while the resin sheet, the sample, and the metal substrate are closely brought into contact with each other by evacuation of spaces formed therebetween, the sample can be heated. In addition, a pressure may be applied onto the resin sheet by air. By this vacuum laminator, the exterior layers (semi-cured state) of the collector wires described above were fully cured, and the collector wires were adhered to the transparent electrodes (ITO layers). In addition, the hard copper foils 113 and the ends of the collector wires were also electrically connected to each other.

Finally, the collector wires and the ITO layers were coated with a resin by spraying, followed by heating for thermal curing, to form a transparent protective layer on the surface, thereby forming the composite 103. As a method for forming this transparent protective layer, a method was employed comprising the steps of: forming a coating solution composed of a resin mixture at a content of 35 percent by weight and a mixed solvent, the resin mixture containing, on a part by weight basis, 52 parts of an acrylic resin made of 2-hydroxyethyl methacrylate, 30 parts of hexamethylene diisocyanate using ε-caprolactam as a blocking agent, 13 parts of an organosiloxane, and 5 parts of γ-glycidoxypropyl trimethoxysilane, the mixed solvent containing 50 parts of xylene and 50 parts of methyl isobutyl ketone; coating the collector wires and the ITO layers with the coating solution by spray coating to form a film 25 μm thick obtained after curing, followed by drying at room temperature for 15 minutes; and performing heating at 200° C. for 10 minutes for curing.

The composite 103 thus formed was separated along the center line of the substrate perpendicular to the side 24 cm long. FIG. 1 illustrates this process with reference to the steps sequentially performed.

The composite 103 was separated using the first rigid body 104 and the second rigid body 105. For a rigid body, powdered high speed steel was used. The first rigid body 104 had a horizontal linear edge 1041 at the topmost portion thereof. The first rigid body 104 further had a horizontal surface 1042. The horizontal degree of the horizontal linear edge 1041 and that of the horizontal surface 1042 were within ±0.5°, and the difference in height between the two ends of the horizontal surface 1042 was sufficiently small as compared to the thickness of the composite 103.

As the first rigid body 104, a rigid body which satisfied the following condition was employed. In a cross-sectional shape (side view of FIG. 1) of the first rigid body 104 taken along a virtual vertical face perpendicularly intersecting a first portion 10411 of the horizontal linear edge 1041, the height (h shown in Step 3 in FIG. 1) in the vertical direction of a convex shape (E shown in Step 3 in FIG. 1) having an apex formed at the intersection (D shown in Step 3 in FIG. 1) between the horizontal linear edge 1041 and the virtual vertical face was larger than the height (t shown in Step 3 in FIG. 1) of the first member 102 in the vertical direction. More specifically, the height in the vertical direction of the convex shape was 300 μm when the height t was 100 μm.

In addition, in the cross-sectional shape (side view of FIG. 1) of the first rigid body 104 taken along the virtual vertical face perpendicularly interesting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle (α shown in Step 3 in FIG. 1) of 45°.

In addition, as the first rigid body 104, a first component including the first portion 10411 of the horizontal linear edge 1041 and a second component integrally assembled with the first component were used. During separation of 2,000 composites, the first portion 10411 of the horizontal linear edge 1041 was chipped in some cases; however, when the first component was only replaced in the case described above, the separation could be easily restarted.

Figure 3:
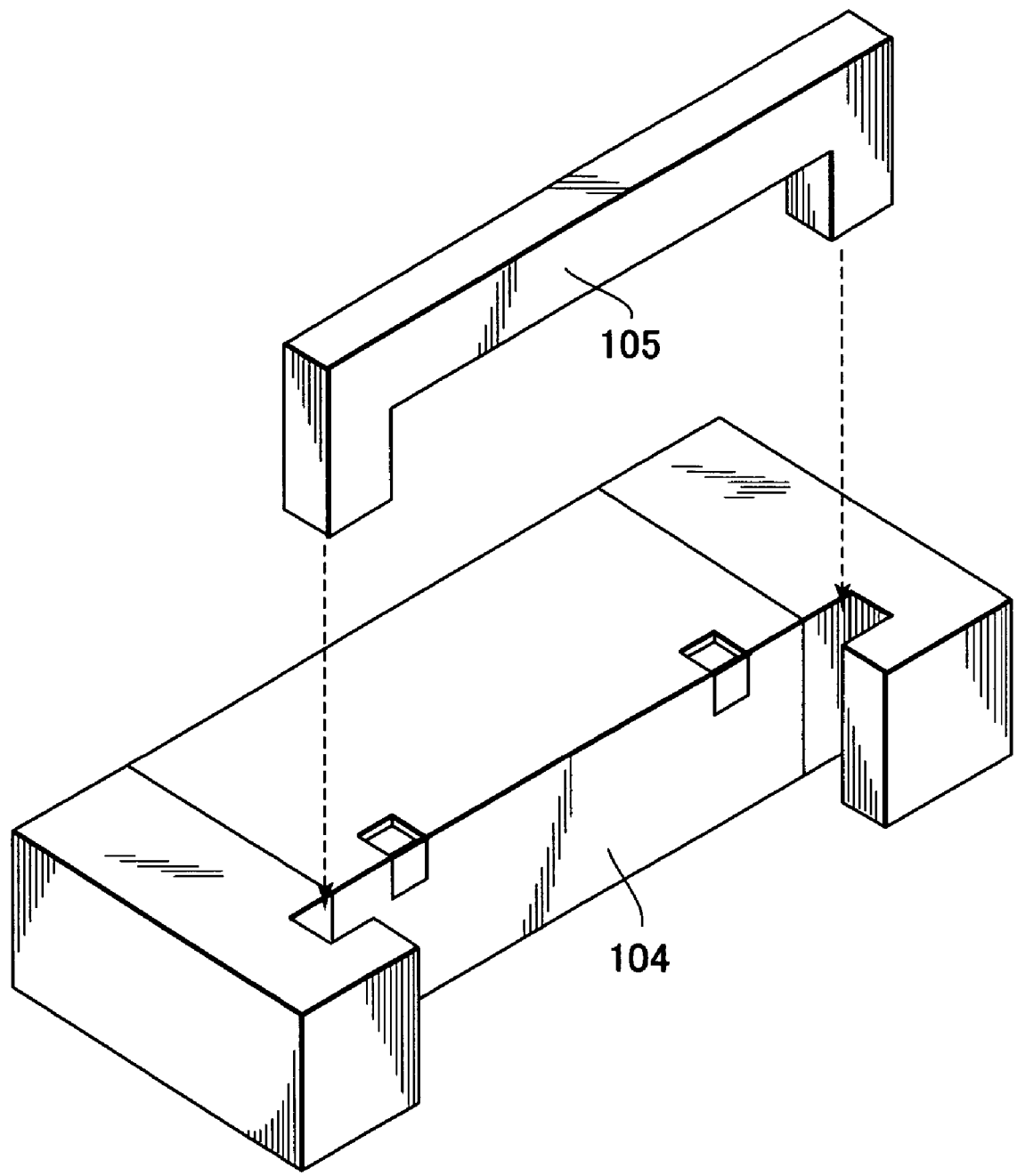
FIG. 3 is a view for illustrating a first rigid body and a second rigid body, which are used in an example according to the present invention.
Figure 4:
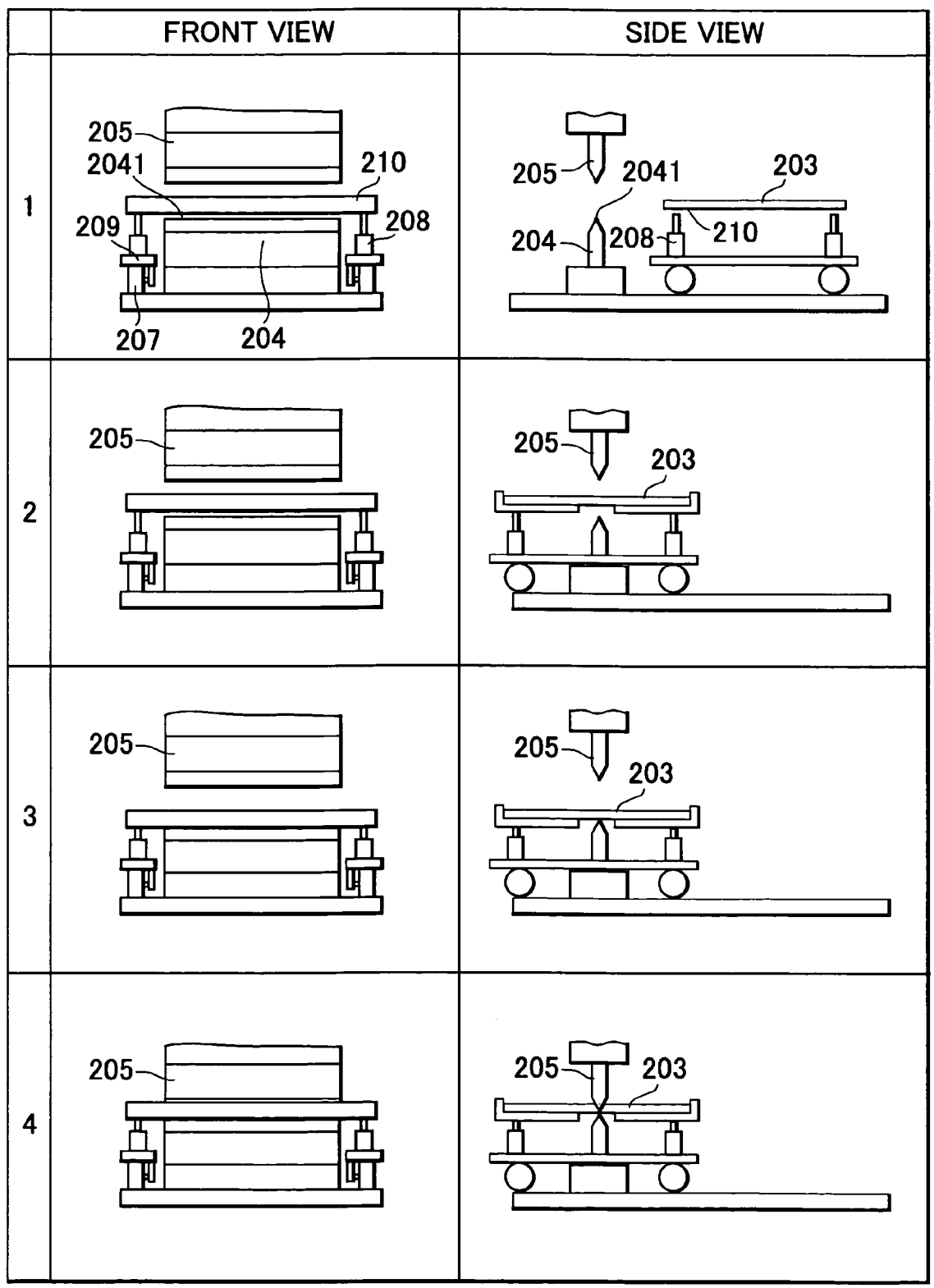
FIG. 4 is a view showing a process for separating a composite, according to a separation method disclosed in Japanese Patent Laid-Open No. 8-103910.

The first rigid body 104 was fixed on a table, and the second rigid body 105 was mounted on a known pressing machine and was moved up and down. The descending speed of the second rigid body 105 was 38 mm/sec. FIG. 3 shows the first rigid body and the second rigid body. The second rigid body 105 had a gate shape and was formed so that the feet thereof were engaged with concave portions of the first rigid body 104. Accordingly, when the first rigid body 104 and the second rigid body 105 sandwiched the composite 103, a force against a force increasing the distance between the first rigid body 104 and the second rigid body 105 could be generated, and as a result, the composite 103 could be accurately separated.

In Step 1 shown in FIG. 1, the state is shown in which the composite 103 was placed on the horizontal surface 1042 of the first rigid body 104. From Step 1 to Step 2, after slid on the horizontal surface 1042, the composite 103 was placed on the first rigid body 104 as shown in Step 2. A method for sliding the composite 103 from Step 1 to Step 2 was performed by a method for pushing an end surface of the composite 103. In particular, an NC controlled auto-hand was prepared, and sliding was performed by pushing the end surface of the composite 103 by this auto-hand. Hence, the sliding could be very easily performed.

In this sliding, since a second portion 10412 of the horizontal linear edge 1041, that is, an edge of the horizontal surface 1042, was present, when simply slid on the horizontal surface 1042, the composite 103 was led onto the horizontal linear edge 1041 by the presence of the horizontal surface 1042. Accordingly, by simply sliding the composite 103 on the horizontal surface 1042, the composite 103 could be easily placed on the first rigid body 104 without being brought into contact with the non-horizontal surface 1043.

As a result, first, deformation, damage, and the like could be prevented when the substrate 101 was brought into contact with the non-horizontal surface 1043 of the first rigid body 104. Second, the accuracy of the position of the composite 103 placed on the first rigid body 104 was improved, and as a result, the accuracy in size of the composite 103 after the separation was also improved.

In Step 2 shown in FIG. 1, after the composite 103 was placed on the first rigid body 104, a holding member (not shown) was moved down from above the composite 103 so as to sandwich the composite 103 with the horizontal surface 1042 of the first rigid body 104, thereby fixing the composite 103 on the first rigid body 104. As the holding member described above, a metal body was used which was provided with a silicone rubber pad at a front end thereof. The position at which the composite 103 was held was on the silver-plated copper foil (not shown) 5.5 mm wide at a distance of 10 mm apart from the horizontal linear edge.

In Step 2 and Step 3 shown in FIG. 1, the second rigid body 105 was moved down from above the composite 103. In this step, since a part of the horizontal linear edge 1041 corresponding to the first region provided with the first member 102 of the composite 103 was the edge of the non-horizontal surface 1043, as the side view shown in Step 3 in FIG. 1, the first rigid body 104 was cut into the first member 102, and in addition, an effect of removing an unnecessary part A of the first member downward along the non-horizontal surface 1043 was also obtained. Due to the effect described above, for a period of time until a gap B between the substrate 101 and the first rigid body 104 shown in the front view in Step 2 disappeared in Step 3, a stress could be reduced that was concentrated on a portion C of the substrate 101 shown in the front view in Step 3 since the substrate 101 was only supported by the first member 102, and as a result, the deformation of the substrate 101 or damage done thereto at the portion C could be prevented.

By sufficiently applying a shearing force to the substrate 101 in Step 3 and Step 4 shown in FIG. 1, the separation of the composite 103 was completed.

Finally, as for 2,000 pieces of the composites 103 thus separated, the deformations of the substrate 101 and the portion C were measured and normalized on the thickness of the first member 102 set as 1.0, and the average values were obtained. In addition, the number of the substrates which were deformed was measured, and the probability of deformation was obtained. In addition, the sizes of 2,000 composites 103 after separation were measured, and the standard deviation thereof was also obtained.

Example 2

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 2 times the height (t shown in Step 3 in FIG. 1) of the first member 102 in the vertical direction.

Example 3

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 1.5 times the height (t shown in Step 3 in FIG. 1) of the first member 102 in the vertical direction.

Example 4

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 1.2 times the height (t shown in Step 3 in FIG. 1) of the first member 102 in the vertical direction.

Example 5

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was equal to the height (t shown in Step 3 in FIG. 1) of the first member 102 in the vertical direction.

Example 6

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 0.8 times the height (t shown in Step 3 in FIG. 1) of the first member 102 in the vertical direction.

Example 7

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 0.5 times the height (t shown in Step 3 in FIG. 1) of the first member 102 in the vertical direction.

Example 8

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the height (h shown in Step 3 in FIG. 1) in the vertical direction of the convex shape (E shown in Step 3 in FIG. 1) having an apex formed at the intersection (D shown in Step 3 in FIG. 1) between the horizontal linear edge 1041 and the virtual vertical face was 0.1 times the height (t shown in Step 3 in FIG. 1) of the first member 102 in the vertical direction.

Example 9

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle (a shown in Step 3 in FIG. 1) of 10°.

Example 10

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle (a shown in Step 3 in FIG. 1) of 20°.

Example 11

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 30°.

Example 12

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 35°.

Example 13

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 40°.

Example 14

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 60°.

Example 15

This example differs from Example 1 only on the following point.

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 70°.

Example 16

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle ($\alpha$ shown in Step 3 in FIG. 1) of 75°.

Example 17

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle (α shown in Step 3 in FIG. 1) of 80°.

Example 18

In the cross-sectional shape (side view of FIG. 1) of the first rigid body 104 taken along the virtual vertical face perpendicularly intersecting the first portion 10411 of the horizontal linear edge 1041, the convex shape (E shown in Step 3 in FIG. 1) having an apex formed at the intersection (D shown in Step 3 in FIG. 1) between the horizontal linear edge 1041 and the virtual vertical face had an apex angle (α shown in Step 3 in FIG. 1) of 85°.

Example 19

This example differs from Example 1 only on the following point.

The method for sliding the substrate 101 on the horizontal surface 1042 from Step 1 to Step 2 was performed by a method for pulling another end surface of the substrate 101 opposite to that described in Example 1. In particular, an NC controlled auto-hand having a suction pad was prepared, and sliding was performed by pulling the end surface of the substrate 101 by this auto-hand. In this case, a mechanism was required inserting the auto-hand between the first rigid body 104 and the second rigid body 105. As a result, the auto-hand must be moved so as not to be brought into contact with the horizontal linear edge 1041 of the first rigid body 104, and hence the conveyor mechanism became complicated as compared to that in Example 1. However, in this case, unlike the case in Example 1, the present invention may be applied to a composite having a substrate composed, for example, of a resin film of small rigidity.

Example 20

This example differs from Example 1 only on the following point.

In Step 2 shown in FIG. 1, after the composite 103 was placed on the first rigid body 104, the following was not performed that a holding member (not shown) was moved down from above the composite 103 to sandwich the composite 103 with the horizontal surface 1042 of the first rigid body 104 for fixing the composite 103 on the first rigid body 104. As a result, the provability of deformation of the substrate was increased; however, the present invention may be applied to a composite composed of a substrate and a fragile member fixed thereon.

Example 21

This example differs from Example 1 only on the following point.

The first rigid body 104 was not formed of the first component including the first portion 10411 of the horizontal linear edge 1041 and the second component assembled therewith and was a one-piece solid body. Accordingly, in separation process for 2,000 composites, when the first portion 10411 of the horizontal linear edge 1041 was chipped, it must be formed again, and hence the separation could not be easily restarted. In addition, the formation of the first rigid body was time and cost consuming. However, in Example 1, the deviation of the relative position between the first component and the second component must be checked at regular intervals. In the case described above, the inconvenience in Example 1 described above did not occur at all.

Comparative Example 1

This comparative example differs from Example 1 only on the following point.

Figure 5:
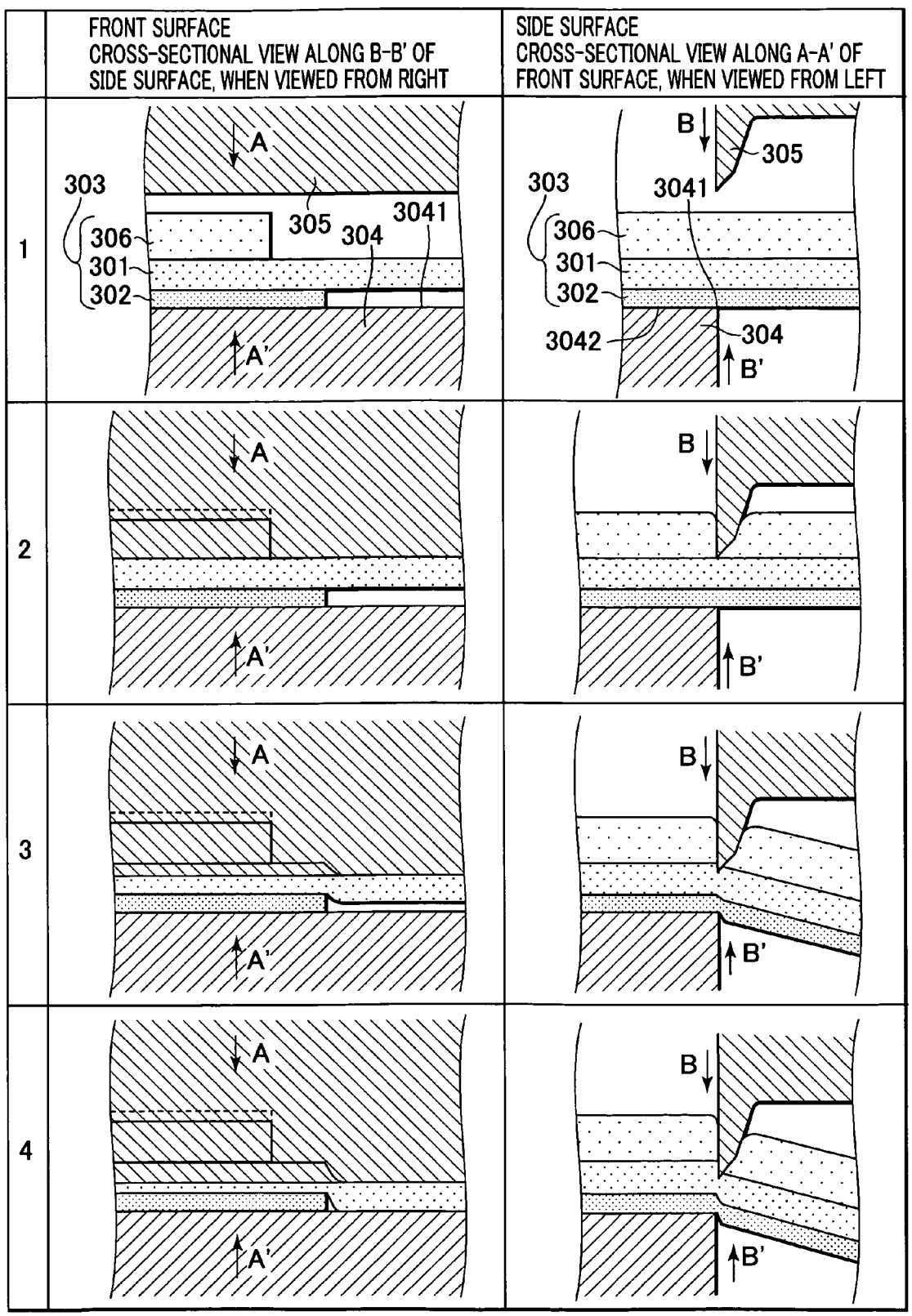
FIG. 5 is a view showing a process for separating a composite, according to a separation method disclosed in Japanese Patent Laid-Open No. 10-335688.

A first rigid body of this comparative example was equivalent to that shown in FIG. 5. That is, in this first rigid body, the entire horizontal linear edge 1041 of the first rigid body 104 according to Example 1 was formed of the edge of the horizontal surface 1042.

Comparative Example 2

This comparative example differs from Example 1 only on the following point.

A first rigid body of this comparative example was equivalent to that shown in FIG. 13. That is, in this first rigid body, the entire horizontal linear edge 1041 of the first rigid body 104 according to Example 1 was formed of the edge of the non-horizontal surface 1043.

After the composites of the examples and comparative examples were separated, the deformations of 2,000 substrates and the sizes of the composites were measured, and in addition, the standard deviations of the size were also calculated. The results are shown in Table 1.

TABLE 1

| | Ratio of Height of Convex Shape of First Rigid Body to Height of First Member | Peak Angle of Convex Shape of First Rigid Body | Average Deformation of Substrate (Normalized on Thickness of First Member Set as 1) | Deformation Probability of Substrate | Standard Deviation of Size after Separation (Normalized on Standard Deviation in Example 1 Set as 1) |
|---|---|---|---|---|---|
| Example 1 | 3 | 45 | 0.00 | 0.001 | 1.0 |
| Example 2 | 2 | 45 | 0.00 | 0.001 | 1.0 |
| Example 3 | 1.5 | 45 | 0.00 | 0.001 | 1.0 |
| Example 4 | 1.2 | 45 | 0.00 | 0.001 | 1.0 |
| Example 5 | 1 | 45 | 0.00 | 0.001 | 1.0 |
| Example 6 | 0.8 | 45 | 0.10 | 0.950 | 1.0 |
| Example 7 | 0.5 | 45 | 0.40 | 0.983 | 1.0 |
| Example 8 | 0.1 | 45 | 0.80 | 0.995 | 1.0 |
| Example 9 | 3 | 10 | 0.00 | 0.051 | 1.0 |

TABLE 1-continued

| | Ratio of Height of Convex Shape of First Rigid Body to Height of First Member | Peak Angle of Convex Shape of First Rigid Body | Average Deformation of Substrate (Normalized on Thickness of First Member Set as 1) | Deformation Probability of Substrate | Standard Deviation of Size after Separation (Normalized on Standard Deviation in Example 1 Set as 1) |
|---|---|---|---|---|---|
| Example 10 | 3 | 20 | 0.00 | 0.045 | 1.0 |
| Example 11 | 3 | 30 | 0.00 | 0.009 | 1.0 |
| Example 12 | 3 | 35 | 0.00 | 0.003 | 1.0 |
| Example 13 | 3 | 40 | 0.00 | 0.001 | 1.0 |
| Example 14 | 3 | 60 | 0.00 | 0.001 | 1.0 |
| Example 15 | 3 | 70 | 0.00 | 0.001 | 1.0 |
| Example 16 | 3 | 75 | 0.50 | 0.957 | 1.0 |
| Example 17 | 3 | 80 | 0.60 | 0.983 | 1.0 |
| Example 18 | 3 | 85 | 0.70 | 0.994 | 1.0 |
| Example 19 | 3 | 45 | 0.00 | 0.001 | 2.0 |
| Example 20 | 3 | 45 | 0.01 | 0.003 | 1.0 |
| Example 21 | 3 | 45 | 0.00 | 0.001 | 1.0 |
| Comparative Example 1 | — | — | 1.00 | 1.000 | 1.0 |
| Comparative Example 2 | 3 | 45 | 0.00 | 0.001 | 13.0 |

The effects and advantages of the present invention are apparent from the results shown in Table 1. In addition, when Examples 1 to 5 are compared to Examples 6 to 8, it is apparent that when the convex shape of the first rigid body has a height equal to or larger than that of the first member, the deformation of the substrate can be effectively suppressed, and the separation thereof can be accurately performed with high yield. In addition, when Examples 1 and 11 to 15 are compared to Examples 9, 10, and 16 to 18, it is apparent that when the apex angel of the convex shape described above is in the range of from 30 to 70°, particularly, the deformation of the substrate can be effectively suppressed.

As has thus been described, according to the separation methods and separation apparatuses of the preferable embodiments of the present invention, when the composite composed of the substrate and the first member fixed onto a part of the bottom surface thereof is separated by simultaneously applying a shearing force by the first and the second rigid bodies to the first region provided with the first member and the second region provided with no first member, the composite can be moved onto the proper position without causing any deformation of the substrate and damage thereto and can then be accurately separated with high yield.

While the present invention has been described with reference to what are presently considered to be the preferred embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A method for separating a composite having at least a substrate and a first member fixed onto a part of the bottom surface of the substrate using a first rigid body and a second body, the first rigid body having a horizontal surface on which the composite is to be placed and a non-horizontal surface on which the composite is not to be placed, the horizontal surface and the non-horizontal surface forming a continuous horizontal linear edge, the horizontal linear edge having a first portion which is an edge of the non-horizontal surface and a second portion which is an edge of the horizontal surface; the method comprising the steps of:

applying a shearing force with the first rigid body and the second rigid body to a first region of the substrate which is a region provided with the first member and a second region which is a region of the substrate provided without the first member;

in applying the shearing force, moving the second rigid body down from above a top surface of the substrate while the composite is placed so that the first portion corresponds to the first region or the first region and a first part of the second region and that the second portion corresponds to a remaining part of the second region; and providing the first rigid body with a convex cross-sectional shape when taken along a virtual vertical face perpendicularly intersecting the first portion of the horizontal linear edge, the convex shape having an apex at a position at which the horizontal linear edge and the virtual vertical face intersect each other, with a height of the convex shape in the vertical direction being larger than a height of the first member in the vertical direction.

2. A method for separating a composite having at least a substrate and a first member fixed onto a part of the bottom surface of the substrate using a first rigid body and a second body, the first rigid body having a horizontal surface on which the composite is to be placed and a non-horizontal surface on which the composite is not to be placed, the horizontal surface and the non-horizontal surface forming a continuous horizontal linear edge, the horizontal linear edge having a first portion which is an edge of the non-horizontal surface and a second portion which is an edge of the horizontal surface; the method comprising the steps of:

applying a shearing force with the first rigid body and the second rigid body to a first region of the substrate which is a region provided with the first member and a second region which is a region of the substrate provided without the first member;

in applying the shearing force, moving the second rigid body down from above a top surface of the substrate while the composite is placed so that the first portion corresponds to the first region or the first region and a first part of the second region and that the second portion corresponds to a remaining part of the second region; and providing the first rigid body with a convex cross-sectional shape when taken along a virtual vertical face perpendicularly intersecting the first portion of the horizontal linear edge, the convex shape having an apex at a position at which the horizontal linear edge and the virtual vertical face intersect each other, with an apex angle of the convex shape being in the range of from 30 to 70°.

3. A method for separating a composite having at least a substrate and a first member fixed onto a part of the bottom surface of the substrate using a first rigid body and a second body, the first rigid body having a horizontal surface on which the composite is to be placed and a non-horizontal surface on which the composite is not to be placed, the horizontal surface and the non-horizontal surface forming a continuous horizontal linear edge, the horizontal linear edge having a first portion which is an edge of the non-horizontal surface and a second portion which is an edge of the horizontal surface; the method comprising the steps of:

applying a shearing force with the first rigid body and the second rigid body to a first region of the substrate which is a region provided with the first member and a second region which is a region of the substrate provided without the first member;

in applying the shearing force, moving the second rigid body down from above a top surface of the substrate while the composite is placed so that the first portion corresponds to the first region or the first region and a first part of the second region and that the second portion corresponds to a remaining part of the second region; and pushing an end surface of the substrate to slide the composite on the horizontal surface so that the first portion corresponds to the first region or the first region and the first part of the second region and that the second portion corresponds to the remaining part of the second region.

4. The method for separating a composite, according to claim 3, further comprising the step of, after the pushing step:

moving a holding member down from above to fix the composite between the holding member and the horizontal surface of the first rigid body.

5. The method for separating a composite, according to claim 1, further comprising the step of providing the first rigid body with a first component having the non-horizontal surface and a second component having the horizontal surface, the first component and the second component being integrally assembled.

6. The method for separating a composite, according to claim 2, further comprising the step of providing the first rigid body with a first component having the non-horizontal surface and a second component having the horizontal surface, the first component and the second component being integrally assembled.

7. The method for separating a composite, according to claim 3, further comprising the step of providing the first rigid body with a first component having the non-horizontal surface and a second component having the horizontal surface, the first component and the second being integrally assembled.

* * * * *